US006512358B2

(12) United States Patent
Klöfer et al.

(10) Patent No.: US 6,512,358 B2
(45) Date of Patent: Jan. 28, 2003

(54) MEASURING DEVICE FOR MEASURING A PROCESS VARIABLE

(75) Inventors: Peter Klöfer, Steinen (DE); Alexander Hardell, Lörrach (DE); Ralf Armbruster, Waldkirch (DE)

(73) Assignee: Endress + Hauser GmbH + Co., Maulburg (DE)

( * ) Notice: Subject to any disclaimer, the term of this patent is extended or adjusted under 35 U.S.C. 154(b) by 36 days.

(21) Appl. No.: 09/730,557

(22) Filed: Dec. 7, 2000

(65) Prior Publication Data

US 2002/0005713 A1 Jan. 17, 2002

(30) Foreign Application Priority Data

Jul. 17, 2000 (DE) ........................................ 100 34 684

(51) Int. Cl.[7] ........................ G01R 11/63; G08C 19/02; G05F 1/10

(52) U.S. Cl. ............................... 324/103 P; 324/103 R; 340/870.39; 323/241

(58) Field of Search ......................... 324/103 P, 103 R; 340/870.39; 323/231, 312, 241; 307/52, 60; 327/322

(56) References Cited

U.S. PATENT DOCUMENTS

| | | | | |
|---|---|---|---|---|
| 4,718,776 A | * | 1/1988 | Gilland et al. | 374/149 |
| 4,777,331 A | | 10/1988 | Borst | |
| 4,804,958 A | | 2/1989 | Longsdorf | |
| 5,345,166 A | * | 9/1994 | Leonard et al. | 307/116 |
| 5,648,766 A | * | 7/1997 | Stengel et al. | 331/57 |
| 5,742,225 A | | 4/1998 | Wetzel et al. | |
| 6,133,822 A | * | 10/2000 | Pfandler et al. | 340/310.01 |
| 6,140,940 A | * | 10/2000 | Klofer et al. | 340/310.01 |

FOREIGN PATENT DOCUMENTS

| | | |
|---|---|---|
| DE | 3615463 A1 | 11/1987 |
| DE | 4019523 C2 | 6/1992 |
| DE | 3878253 T2 | 6/1993 |
| DE | 69129189 T2 | 7/1998 |
| EP | 0101528 A1 | 2/1984 |
| EP | 0244808 A1 | 11/1987 |
| EP | 0363001 B1 | 11/1993 |
| EP | 0744724 A1 | 11/1996 |
| EP | 0687375 B1 | 6/1997 |
| EP | 0883097 A2 | 12/1998 |

* cited by examiner

*Primary Examiner*—N. Le
*Assistant Examiner*—Anjan K. Deb
(74) *Attorney, Agent, or Firm*—Jones, Tullar & Cooper, P.C.

(57) ABSTRACT

The invention is directed to a measuring device for measuring an industrial process variable with a predetermined maximum power consumption by the measuring device. More specifically, the invention relates to a measuring device for connection to a current loop, in particular a 4–20 ma current loop, or to a digital communication, comprising devices for regulating the measuring operation of the measuring device in adaptation to the predetermined power consumption, wherein the regulating devices regulate to power consumption by the measuring operation of the measuring device in such fashion that this power consumption is approximated to the predetermined power consumption without the predetermined power consumption being exceeded.

11 Claims, 13 Drawing Sheets

MEASURING DEVICE FOR MEASURING A PROCESS VARIABLE

FIELD OF THE INVENTION

This invention relates to a measuring device for measuring an industrial process variable with a predetermined maximum power consumption by the measuring device. More specifically, the present invention relates to a measuring device for connection to a current loop, in particular a 4–20 ma current loop, or to a digital communication.

PRIOR ART

Devices for measuring a process variable are utilized to detect a process variable and pass the measured values on for subsequent processing. Transmission of the measured values may be effected by means of a current loop or a digital communication. In either case it is of advantage for the measuring device to draw its required power from the two lines via which the measured value is transmitted.

When the measured values are transmitted via a current loop, the current in the loop is selected so that its magnitude reflects the magnitude of the process variable. According to established standards, currents of a magnitude of between 4 ma and 20 ma are currently employed, with a current of 4 ma passing through the current loop being representative of the maximum (or minimum ) measured value, and a current of 20 ma being representative of the minimum (or maximum) measured value of the process variable.

This measurement technique has proven to be largely insusceptible to interference and has found widespread acceptance in industrial applications.

A measuring device supplied with power from a current loop has only a limited amount of power available. This power depends on the supply voltage and the particular current setting to which it is adjusted (according to the measurement value to be provided). Conventional measuring devices are dimensioned so as to make do with the minimum available power, meaning that they require only the power present at a minimum current and a minimum voltage. If more power is available, this additional power is converted into power loss in a current stage, rather than being used in the measuring device for the benefit of the measurement.

Measuring devices driven via a digital communication often have a constant current consumption which is a requirement for data transmission. Here the available power is dependent on the terminal voltage applied. Also in this technique conventional measuring devices are designed so that the measurement circuit has a constant power consumption corresponding to the power at a minimum supply voltage. Any additionally offered power at a higher supply voltage is likewise converted into power loss.

From EP 0 687 375 a suggestion for improvement is known in which an intelligent transmitter is equipped with a sensing circuit. The transmitter is operated at a measuring frequency corresponding to a power consumption exceeding the power available from the current loop at a minimum current and a minimum voltage. If a deficit results (i.e., the consumed power exceeds the permissible available power), the sensing circuit will detect this deficit and cause execution of the measurement routine to be halted until the deficit is made up.

Aside from producing other problems, this approach leads to repeated measurement errors which is not acceptable.

SUMMARY OF THE INVENTION

It is an object of the present invention to provide a measuring device of the type initially referred to which is in a position of matching its power requirements to the available power without incurring the risk of erroneous readings.

Desirably, the total amount of power consumed to perform the measuring task is an as closely as possible approximation to the amount needed to optimize speed and quality of the measurement. Theoretically, therefore, the total power which corresponds to the particular measurement value to be read would be consumed by the correspondingly frequent operation of the sensing element. In practice, however, safety reasons demand that a certain difference remain between the available power and the power consumed to perform the measuring task in order to prevent a power deficit and hence a malfunction of the sensor from occurring. The surplus of power is converted into power loss (heat) in the measuring device. The sum of the two combined power consumptions must be precisely of a magnitude causing the total current consumed by the sensor to correspond to a defined value. With the sensor this value is predetermined within a current loop (4–20 ma) by the actual measurement value to be output.

With a sensor communicating digitally, for example, the value of the constant current consumption corresponds the general specifications in connection with the communications protocol employed.

According to the invention the object is solved with the combinations of features as defined in the independent claims.

Generally, in the most preferred embodiments of the invention the desired adaptation of the power consumed for performing the measuring task to the available power without exceeding it is made possible by determining the actual surplus of power which would have to be converted into power loss. Following determination of this actual surplus, the control unit of the sensor is in a position, by making appropriate provision with respect to type and frequency of the measurement cycles performed, to approximate the power consumption of the measuring device to the predetermined maximum available power so that the surplus is minimized without falling below a predetermined limit for the surplus. (Ideally, therefore, the surplus at this limit is at least approximately equal to zero.)

Determination of the actual surplus may be effected by direct measurement of the surplus current or the surplus power. However, an indirect approach is equally possible, comprising the steps of measuring the current or consumed power for performing the measuring task and measuring the available power or using the known amount of available current, and determining the actual surplus by subtraction. When the indirect approach of surplus determination is selected, a substantial simplification incurring a minor disadvantage is achievable by dispensing with individual measurements for current or power determination, substituting therefor suitable estimations and keeping larger reserves.

Furthermore, in the determination of the power consumed for carrying out the measuring task it is often possible to limit such determination to the power consumption of those circuit elements which are known to carry most of the weight.

The present invention is suitable for any type of measuring device for process variables, provided that these measuring devices are assigned a predetermined power consumption externally, usually a varying maximum power consumption. This involves, for example, specifying the power consumption when power is supplied by a loop, because (varying with the measurement value to be indicated) only such a maximum amount of power may be consumed as corresponds to the current allowed to flow in the supply lines to provide an accurate readout.

It will be understood, of course, that the power consumption limit imposed on the measuring device may also result from other considerations as, for example, the connection with a digital communication, or for entirely different reasons.

Specifically, the present invention is particularly suited for use with sensors as, for example fluid level sensors. The present invention will be described in the following with reference to two embodiments involving a radar fluid level sensor on the one hand and an ultrasonic fluid level sensor on the other hand. Typically, such sensors are nowadays powered by current loops or digital communications (Profibus Pa., Fieldbus Foundation, . . . ), hence encountering the difficulties to be overcome according to the invention.

A preferred implementation of the invention utilizes a current stage generally connected in parallel with the remaining components of the measuring device. The current stage serves to consume the power ("power loss") that remains after subtracting the power demand of the measuring device in the measurement mode from the total power (predetermined by the measurement value readout function). As set forth previously, this non-used power surplus is a measure of the reserve available in the system for increasing the measurement performance without producing the deficit referred to in the prior art (EP 0 687 375).

Such a current stage offers a variety of possibilities of measuring the power surplus as will be explained in the following with reference to the preferred embodiments.

One such possibility comprises measuring the instantaneous power surplus directly. Alternatively, it may also be the subject of prior estimation. To do this, known data of the measuring device as, for example, the relatively high power consumption of individual components, may be referred to.

It is not always necessary to perform a continuous measurement or calculation of the continuously varying power demand. A simpler solution comprises subdividing the total range available, that is, for example, 4 to 20 ma, into sub-ranges each of which is assigned a specific frequency of measurement per unit of time. This is a very simple way of effecting measurements relatively frequently in the sub-range corresponding to the highest predetermined power consumption, whereas in those sub-ranges which correspond to lower available power, the frequency of measurement is correspondingly lower.

Then it only need be monitored in which sub-range the system is currently operating, which, for example, in the event of a 4–20 ma current loop being connected depends on which measurement value has to be output and to which current this then corresponds in order to then select the mode of operation correspondingly.

The connection of the measuring device to a digital communication or a current loop connected thereto enables completely analog arrangements to achieve the same advantages.

DESCRIPTION OF THE PREFERRED EMBODIMENTS

Preferred embodiments of the present invention will be described in the following, reference being had by way of example to measuring devices of the invention. A measuring device invariably comprises a prior-art part corresponding to FIG. 1 or 2, and a connection to the supply according to FIGS. 3 to 6 or 8 to 13.

A first exemplary embodiment of a measuring setup of the invention is a radar fluid level sensor. The sensor detects the fluid level in a reservoir. The measured value is transmitted either via a current loop at, for example, 4 to 20 ma, or via a digital communication, as a field bus.

Figure 1:
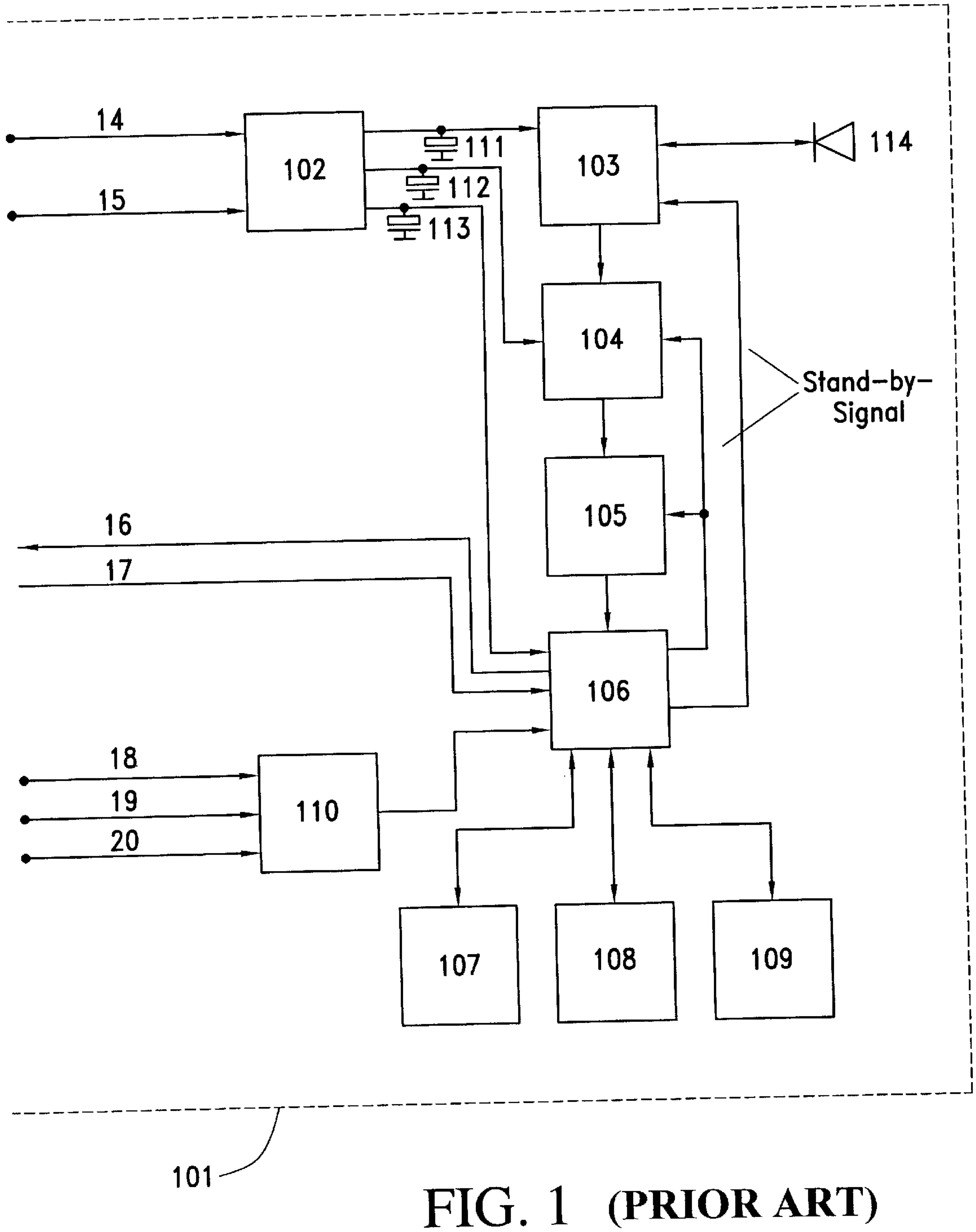
FIG. 1 (PRIOR ART)
FIG. 1 shows in block diagram form part of a prior art radar sensor.

FIG. 1 shows part of such a radar sensor (101). The Figure shows the prior-art part which is independent of how the measured value is transmitted.

For energy supply to the sensor (101), a power supply (102) is used which is connected to a current stage via supply lines (14) and (15).

Control of the sensor is effected by a microcontroller (106) having its program stored in a program memory (107). It uses an EEPROM (109) and a RAM (108) for data storage. The microcontroller controls the HF front end (103) which produces radar signals, transmits them to the antenna (114) and processes the received signals. These signals are processed by the receiver (104), digitized by an analog-to-digital converter (105) and passed to the microcontroller. The microcontroller determines a measured value from the digital signals. Upon conversion, if any, the microcontroller passes the measured value via a control line (16) to the current stage (see further below) which, in response to this value, sets a particular current, or to the digital interface which passes the measured value on via a digital communication. The control lines (16) and (17) are utilized as connection to the digital interface. To reduce the power consumption, the microcontroller has the possibility, via standby signals, of placing the HF front end, the receiver or other circuit elements into a reduced power consumption sleep mode or disabling these components entirely, as described further below. To measure the sensor's actual power consumption, measuring lines (18)–(20) and an analog-to-digital converter (110) connected to the microcontroller (106) may be used. The microcontroller features a low power consumption mode. Capacitors (111), (112) and (113) operate to reduce the current fluctuations occurring as the components are turned on and off.

By varying the duration and frequency of the sleep mode into which the microcontroller places the individual components, the microcontroller is in a position to influence the sensor's power demand.

Figure 2:
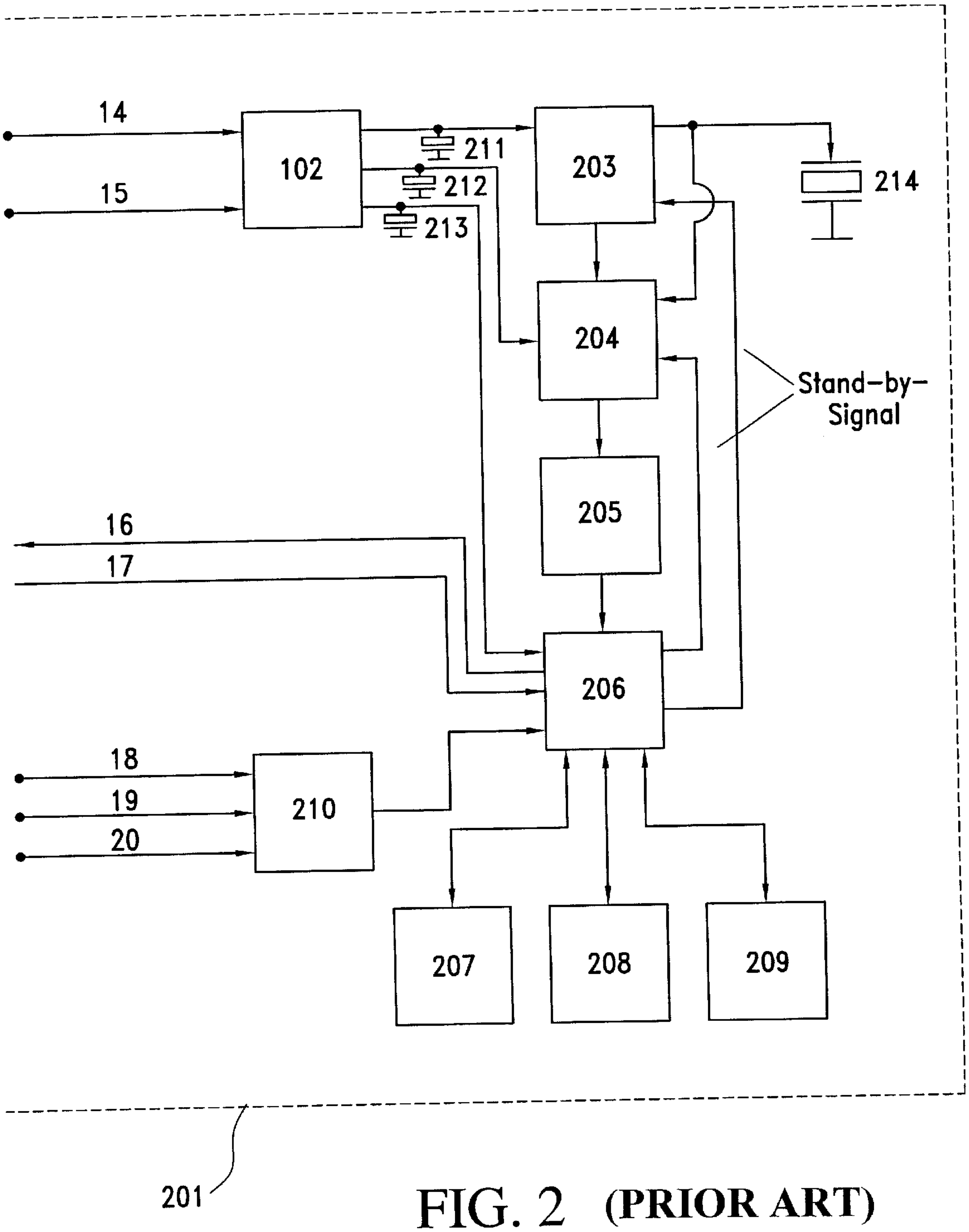
FIG. 2 (PRIOR ART)
FIG. 2 shows in block diagram form a known ultrasonic sensor.

FIG. 2 shows as a second exemplary embodiment an ultrasonic sensor (201) of similar construction. Control of the sensor is by a microcontroller (206) having its program stored in a program memory (207). It uses an EEPROM (209) and a RAM (208) for data storage.

The microcontroller controls the ultrasonic transmitter (203) which supplies drive signals for the acoustic transducer (214). As a result, the acoustic transducer (214) generates acoustic waves which are emitted and reflected by a reflecting medium. The acoustic transducer converts the received signals into electrical signals which are fed to the receiver (204). The receiver amplifies and filters the signal before it is passed to the microcontroller (206) via the analog-to-digital converter (205). The microcontroller (206) determines from this signal a measurement value which it transmits, following conversion, if any, via the control line (16) either to the current stage which in response to this value sets a particular current, or to the digital interface which passes the measured value on via a digital communication.

Figure 3:
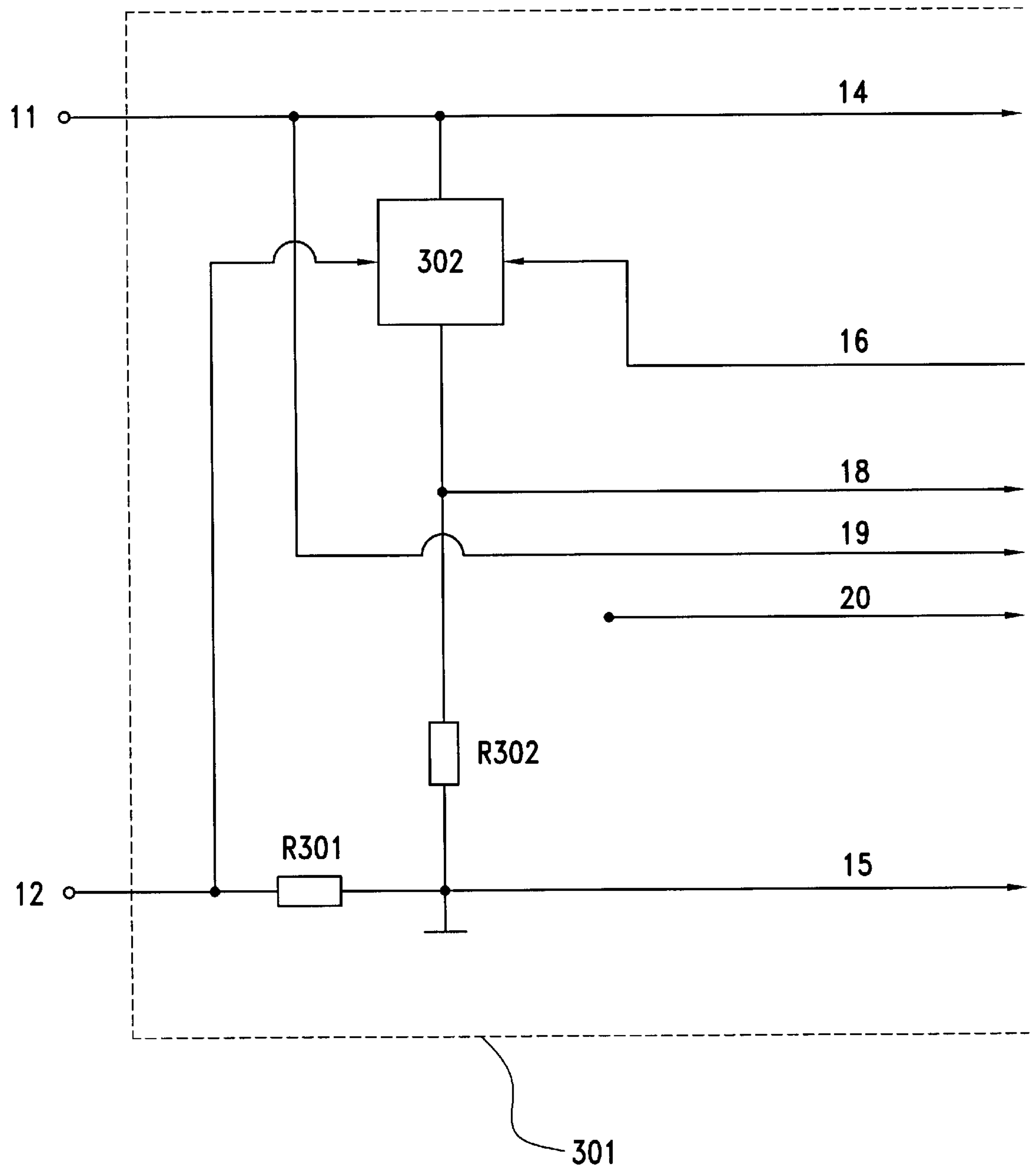
FIG. 3 shows a first embodiment of a current stage according to the present invention.

A first preferred implementation of the solution of the invention for the embodiments of FIGS. 1 and 2 is illustrated in FIG. 3. It serves to measure the power surplus available for optimizing operation of the measuring device by means of a current stage (302). The measuring device (301) of FIG. 3 is powered from a current loop via the terminals (11) and (12).

The current stage (302) is connected in parallel with the remaining circuit of the measuring device. The current stage monitors the total current through the voltage drop across a resistor (R301), maintaining it constant. The current passing through the current stage is regulated so that the total current passing through the resistor (R301) remains constant and corresponds to the value predetermined by the control line (16).

The current flowing to the terminals of the measuring device splits into a component flowing through the supply line (14) and a component flowing through the current stage (302). The current passing through the supply line (14) is utilized by the measuring device for operation, while the current through the current stage, rather than being used for the supply of the measuring device, is instead a measure of the actual power surplus. The microcontroller measures this surplus, illustrated in FIG. 3 as voltage measurement across a resistor (R302), setting the current consumption of the sensor at a value such that a sufficient, though as small as possible, surplus remains at all times. When the surplus becomes smaller, parts of the measuring device (e.g., the transmit and receive area, or alternatively the entire signal generating and processing area) are placed in a sleep mode to reduce current consumption. In the presence of a correspondingly reduced surplus it is possible to halt program execution intermittently, as described in the prior art (EP 0 687 375).

Because a small amount of excess current is allowed to flow at all times, the current stage has the possibility of correcting short-term power fluctuations without a deficit occurring. Fluctuations may include, for example, a brief additional power demand or a fluctuation in the supply voltage.

The accuracy of power surplus measurement will be enhanced by measuring, in addition, the voltage at the supply line+(14) by means of the measuring line (19). The amount of power surplus is then obtained directly by multiplying the current and voltage values.

Figure 4:
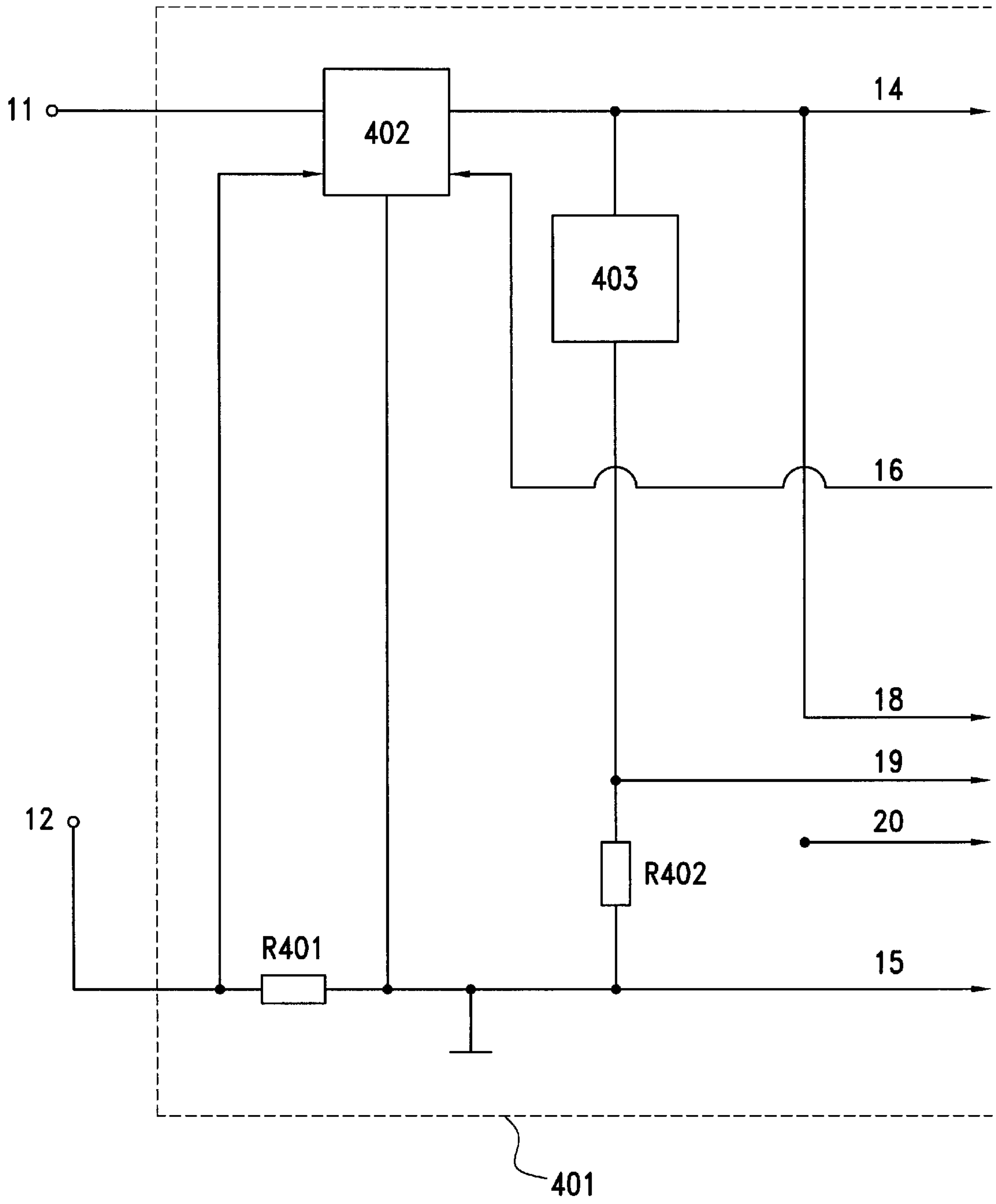
FIG. 4 shows another embodiment of a current stage according to the present invention.

FIG. 4 shows alternative possibilities of creating the current stage (402). Here it is connected in series with the supply lines (14, 15). Downstream of the current stage is a zener diode (403) (or alternatively, an electronic circuit having a current consumption variable in response to the voltage). (The electronic circuit is conventionally the preferred solution). As above in FIG. 3, the total current of the complete measuring device is sensed across a resistor (R401) and regulated accordingly. Downstream of the current stage, the current splits into a component utilized for supplying the measuring device (supply line+(14)) and a surplus component picked up by the zener diode. Measurement of the surplus is effected by means of the voltage drop across a resistor (R402), the current through (R402) being a measure of the actual power surplus.

A more accurate determination of the power surplus is obtained by having the measuring line (18) perform an additional measurement of the voltage at the supply line+ (14).

Figure 13:
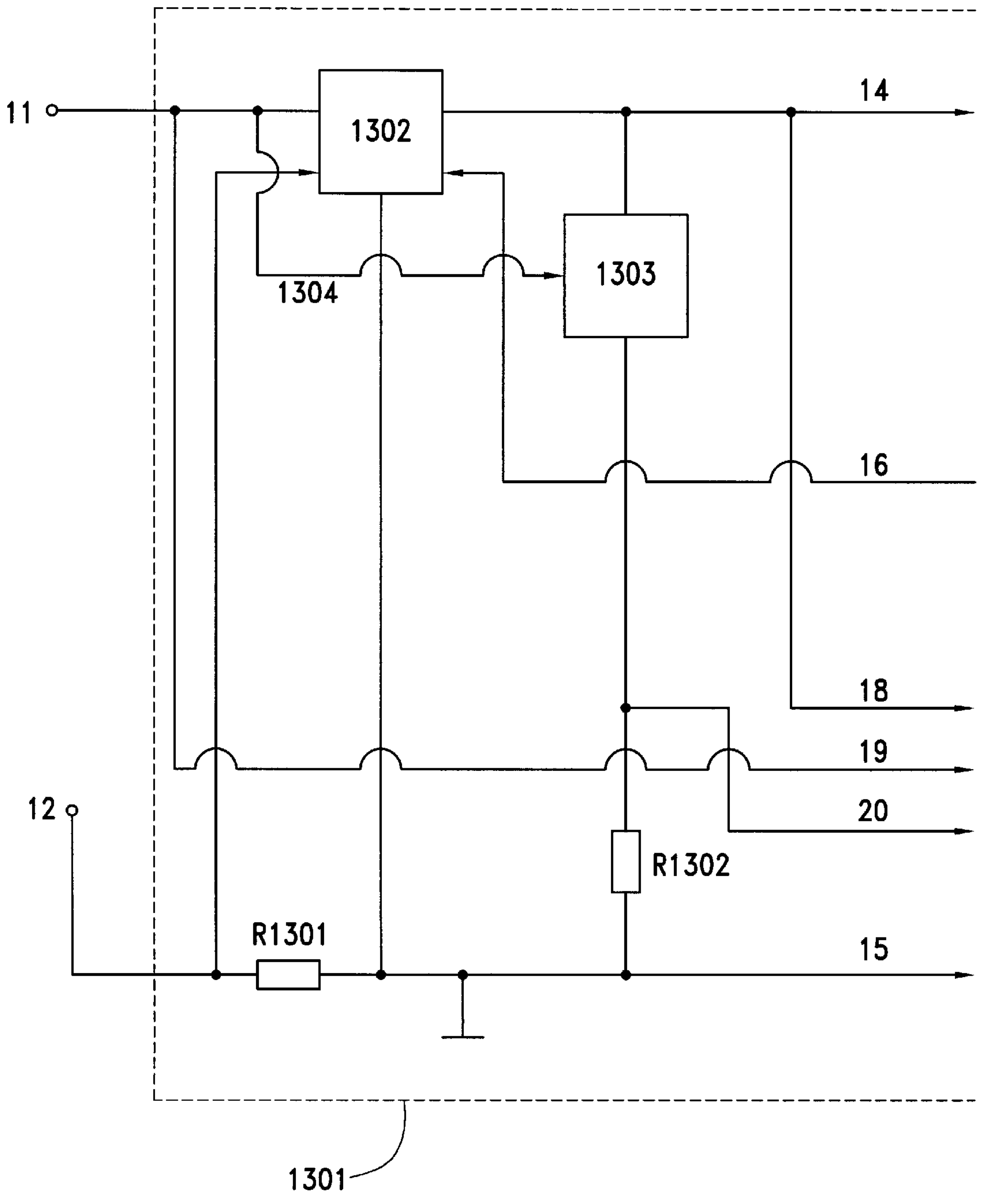

FIG. 13 shows a circuit arrangement improved over the one of FIG. 4. A current stage (1302) is connected in series with the supply lines. Downstream of the current stage is a circuit (1303) picking up excess power. To do this, it senses the voltage at the supply line+(14) and, by means of a line (1304), the voltage upstream of the current stage. In the process, the current taken up by the circuit (1303) is of a magnitude precisely such that the voltage drop across the current stage (1302) becomes as small as possible to reduce power loss, yet remains sufficiently large to enable the current stage to maintain the current at a constant level even in the presence of fluctuations in the supply voltages or the sensor's current consumption. A measure of the power surplus hence results from the current through the circuit (1303) measured, for example, through the voltage drop across (R1302) by means of the measuring line (20).

Power surplus measurement precision will be enhanced by measuring, in addition, the voltage at the supply line+ (14) by means of the measuring line (18).

Figure 5:
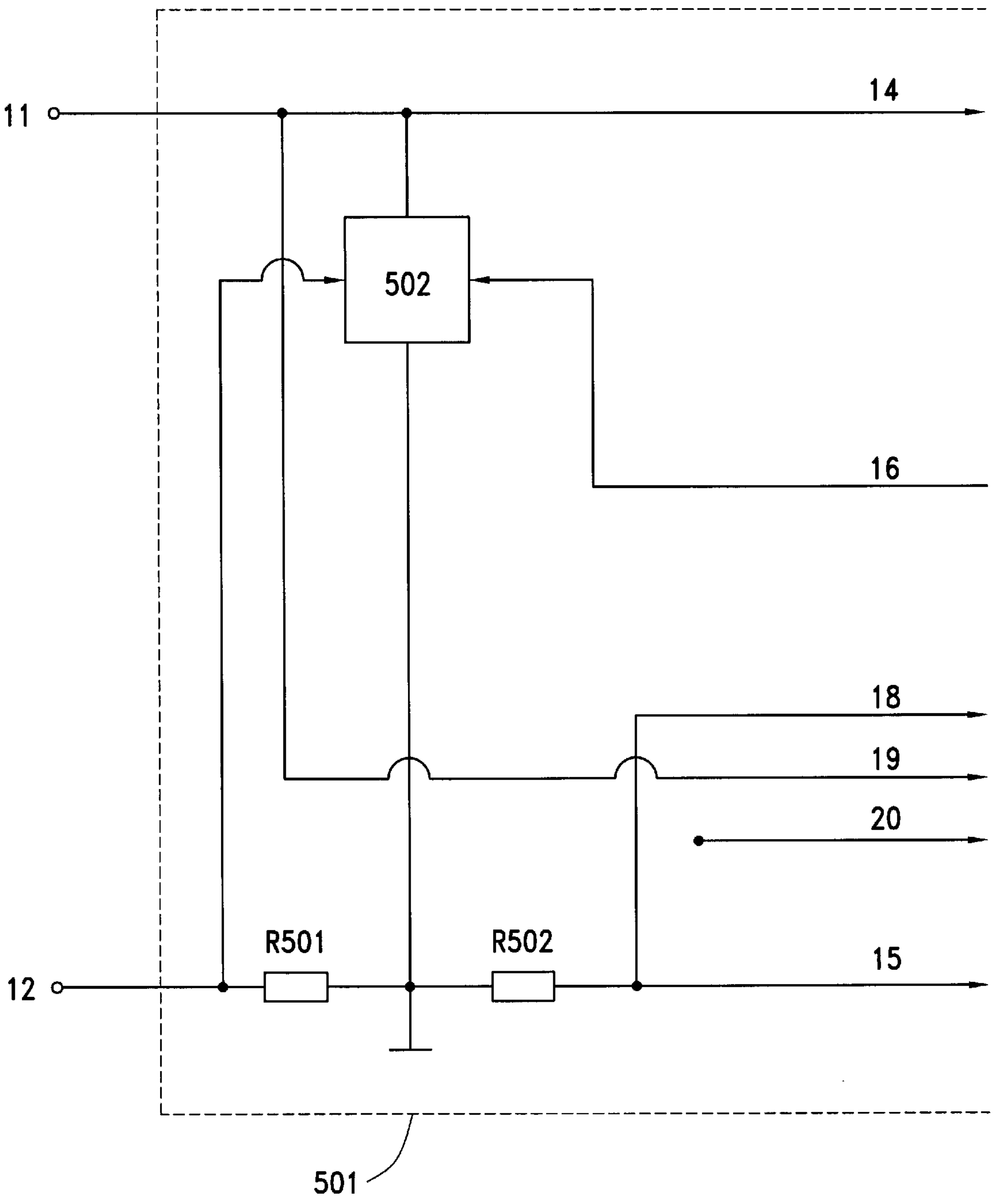
FIG. 5 shows a variant of the first embodiment of FIG. 3.

FIG. 5 shows a current stage (502) comparable to that of FIG. 3. In contrast thereto, the instantaneous power surplus is not measured directly. The current demand of the measuring device is determined via a resistor (R502). A measure of the surplus is derivable from the difference between the known current flowing in the current loop and the current demand of the measuring device through (R502). Here too, a more accurate determination of the power surplus can be obtained by an additional measurement of the voltage available at the supply line+(14) using the measuring line (19).

Figure 6:
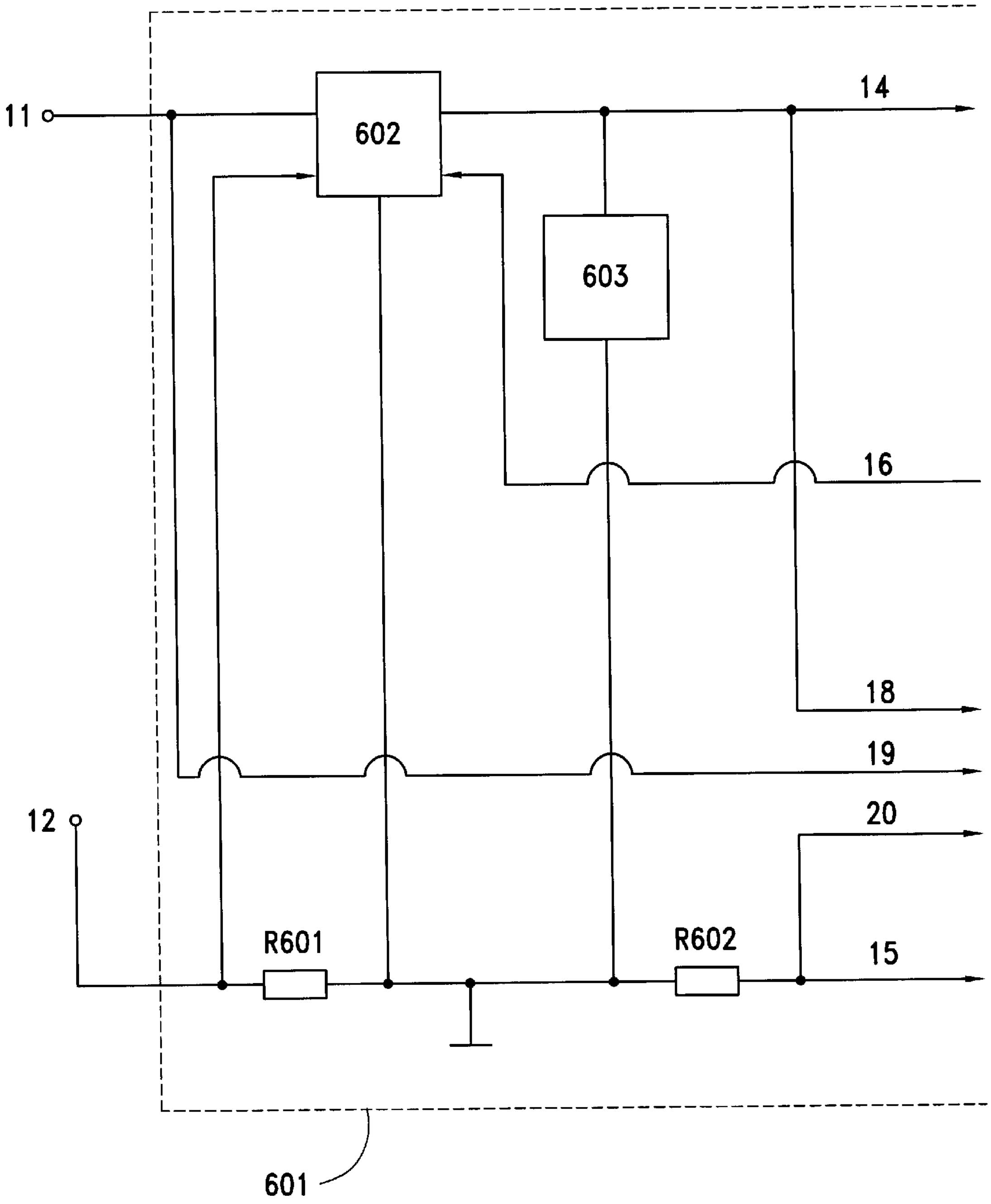
FIG. 6 shows a variant of the embodiment of FIG. 4.

FIG. 6 represents a current stage (602) similar to the one of FIG. 4. In contrast to the measuring device of FIG. 4, the surplus is not measured directly, but rather, a determination is made of the input power at the terminals of the measuring device and the power requirements for supply of the measuring device. The input power results from the known current flowing in the current loop, and the input voltage measured by means of the measuring line (19). The power requirements for supply of the measuring device are determined from the current through (R602) and the supply line+(14) voltage measured by means of the measuring line (18). The difference of the two power levels is a measure of the actually available power surplus.

Figure 7:
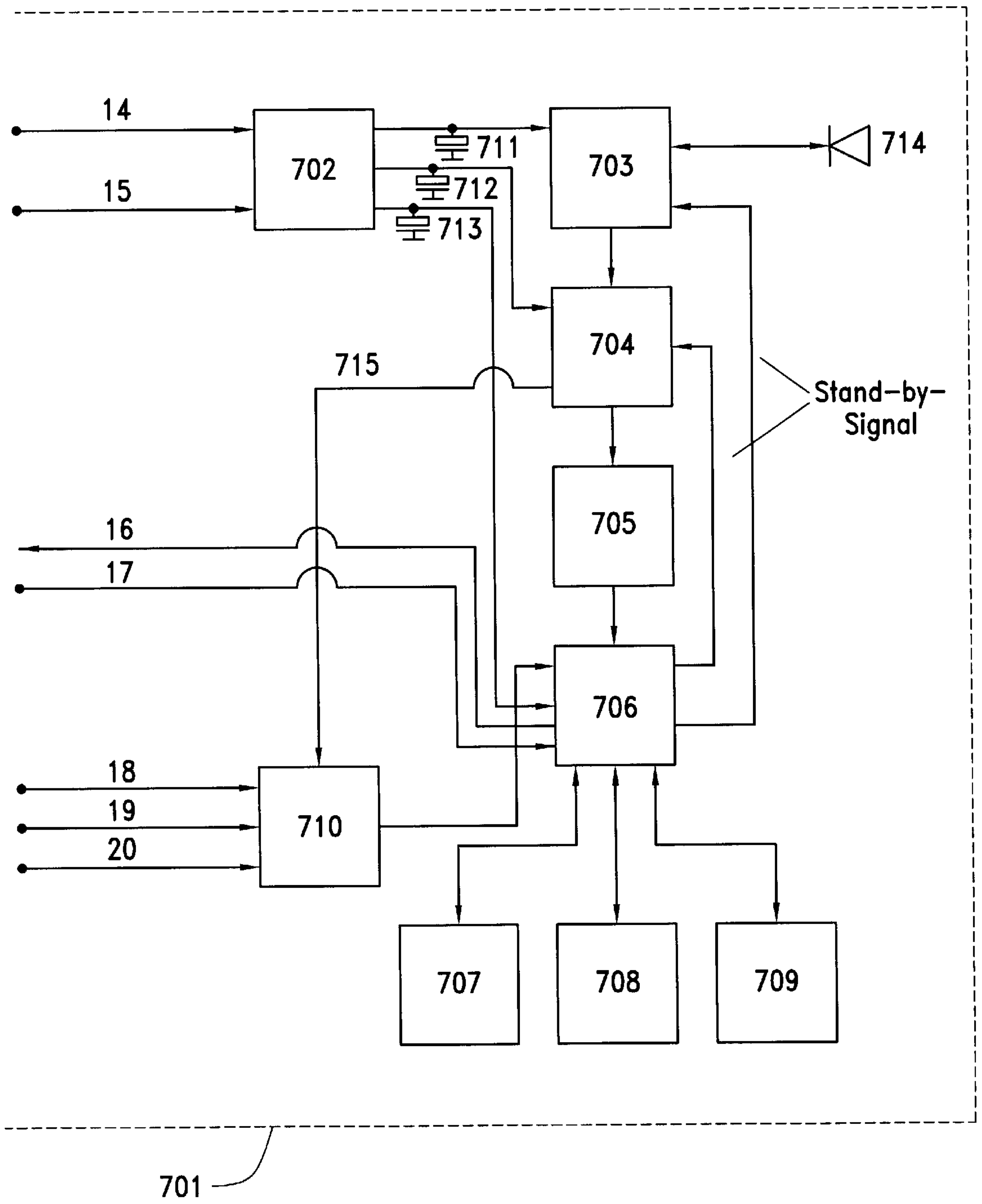
FIG. 7 shows in block diagram form a radar sensor according to the present invention.

Frequently the power consumption of the measuring device (101, 102) is essentially determined by one or several large loads. Information available of the power consumption of these components permits information of the power consumption of the measuring device to be obtained, for example, by assuming a worst-case value for the unknown power consumption of the other components. In addition, the available power is determined as illustrated, for example, in FIGS. 3 to 6, determining therefrom the power surplus. The microcontroller determines, on the basis of the power surplus, whether parts of the measuring device have to be placed into the sleep mode referred to in the foregoing in order to control the power consumption of the measuring device. In this regard FIG. 7 shows as a further preferred embodiment of the invention a radar sensor obtaining information of the power consumption of the receiver (704) by means of a measuring line (715). Whether the sensor is powered from a current loop or a digital communication has no relevance. The same procedure can be applied where an ultrasonic sensor or a sensor with conductor-guided radar is employed. The only thing that matters is that one or several main loads be identified whose actual power demand is determined.

The above-described arrangements can be simplified. Such embodiments of the invention will be described in the following with reference to FIGS. 8 and 9.

Figure 8:
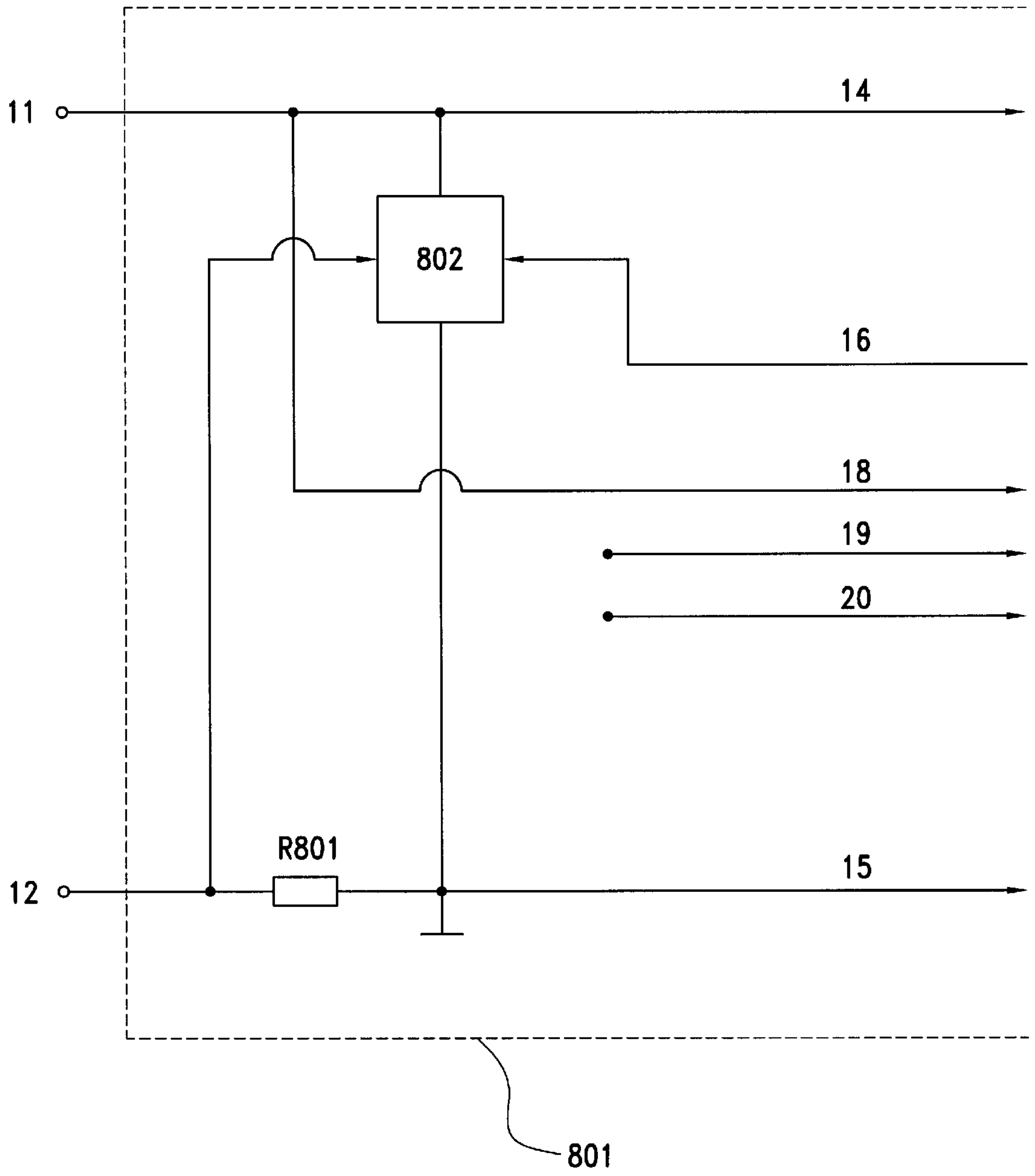
FIG. 8 shows a current stage employed with the sensor of FIG. 7.
Figure 9:
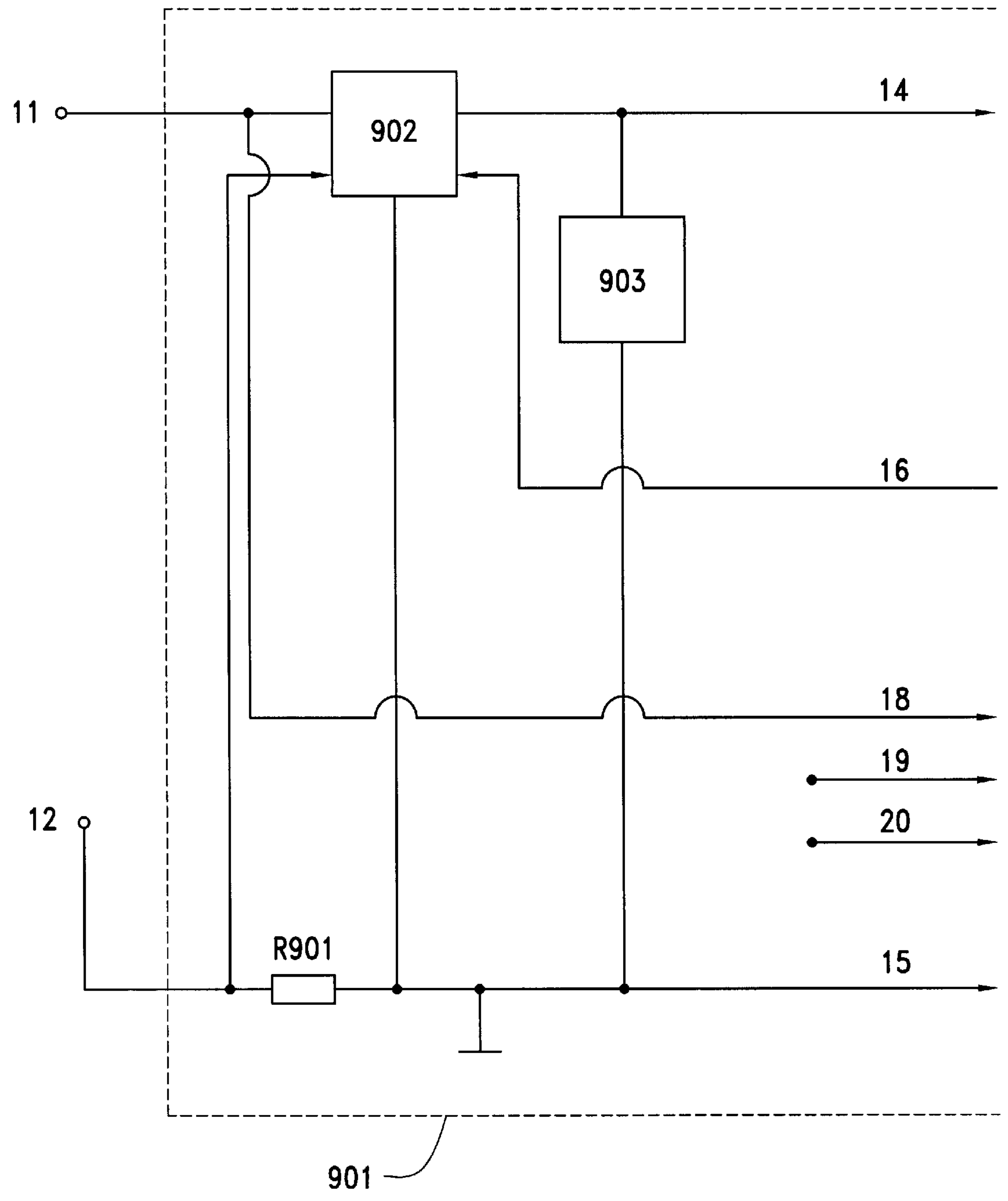
FIG. 9 shows a variant of the current stage of FIG. 8.

To obtain an approximate information as to the amount of surplus currently available, it can be sufficient to determine only the available power. This can be determined, for example, from the input current and the input voltage. The input current is a known quantity, being predetermined to the current stage by the microcontroller via the control line (16), while the input voltage is measured by means of a measuring line (18) as shown in FIGS. 8 and 9. In response to the available power determined, the sleep modes of the individual components can then be utilized to adapt the sensor's power consumption to the available power such that a certain power surplus is maintained at all times.

From this a simplification develops which comprises omitting the measurement of the input voltage, in which case the measuring line (18) in FIGS. 8 and 9 is not needed. By referring to the set current which, being predetermined to the current stage by the microcontroller via the control line (16), need not be measured, an information as to the available power is obtainable. At a maximum current, for example, 20 ma, a relatively high amount of power is available even at a minimum voltage, while little power may be available at relatively small currents in the proximity of, for example, 4 ma. It is therefore sufficient to control the sleep modes only as a function of the set current and to adjust the duration and frequency at which the sleep modes are activated such that the available power is not exceeded, not even in the presence of a minimum input voltage and maximum power consumption of the individual components.

Figure 10:
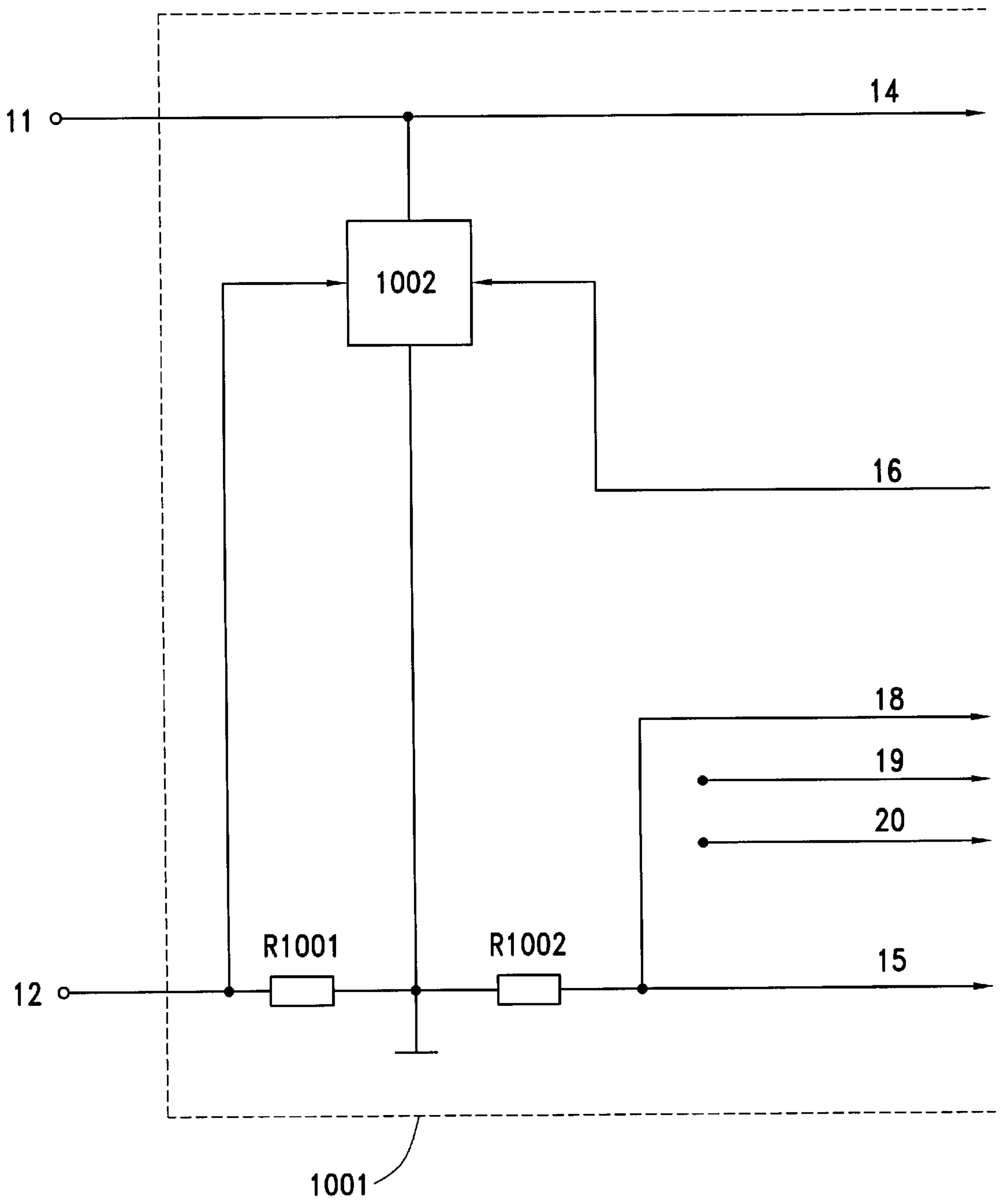
FIGS. 10–13 show further variants of a current stage according to the present invention.
Figure 11:
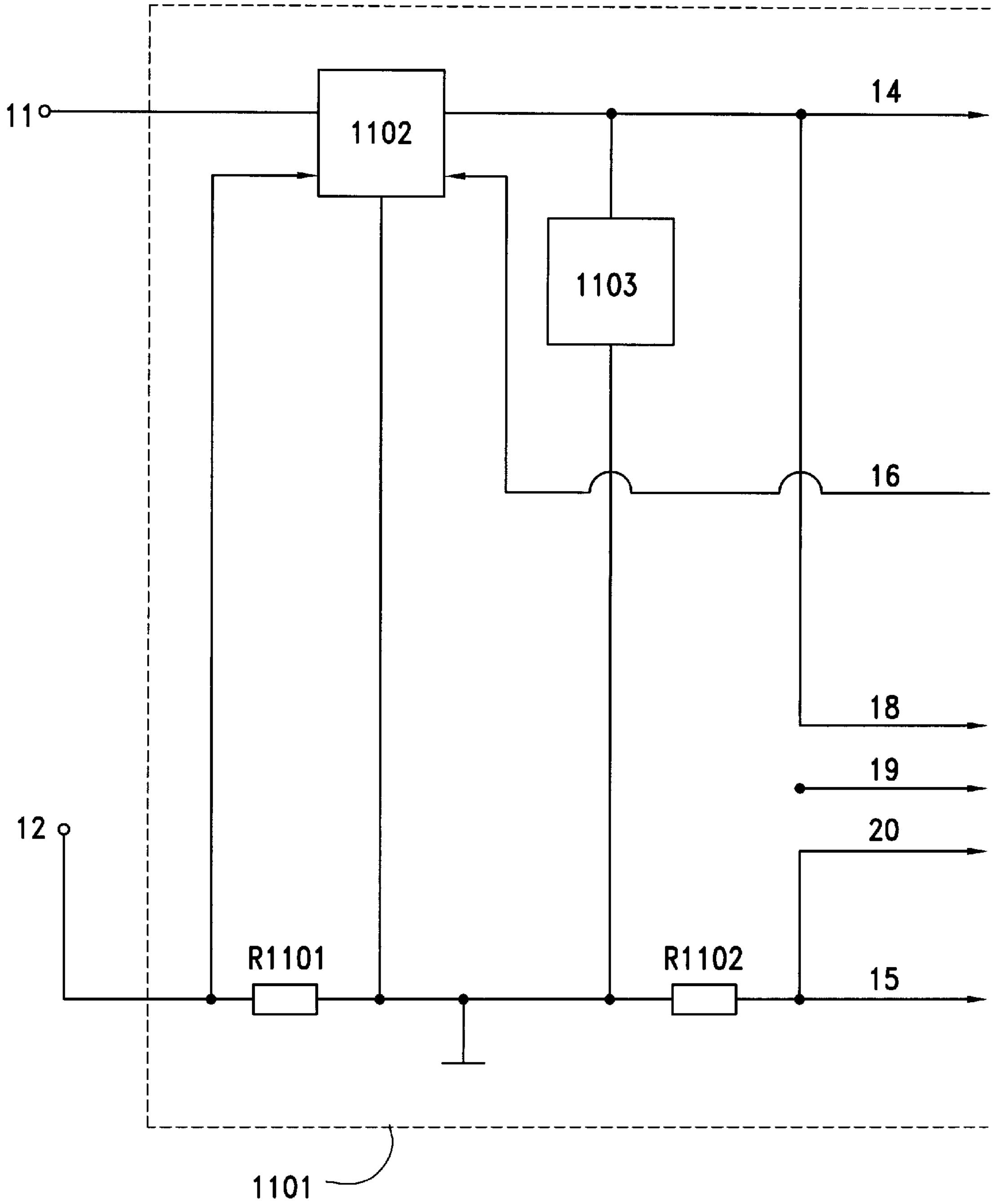

Further preferred simplifications of the invention are illustrated in FIGS. 10 and 11. Here it is only the instantaneously required current that is measured as a voltage drop across resistor (R1002) by means of the measuring line (18) and, respectively, across (R1102) by means of the measuring line (20). The microcontroller is capable of regulating this current by controlling the sleep conditions so that it always remains below the actually available current.

Proceeding from FIG. 7, it is possible in a further simplification to determine only the power demand of one or several main loads and control, as a function thereof, the sleep conditions of the components, without determining the available power.

Where measuring devices connected to a digital communication as, for example, a field bus, are used the demands placed on the measuring device are similar. The current which the measuring device may draw from the digital bus has to be constant, being conventionally set at a fixed value. Here too, there is a need to match the power consumption of the measuring device t o the power offered. The manner in which th is c an be implemented corresponds to what has been set out in the fore going. Worthy of note is only that the current through the current stage, rather than being dependent on the measured value, is conventionally set at a fixed value instead.

Figure 12:
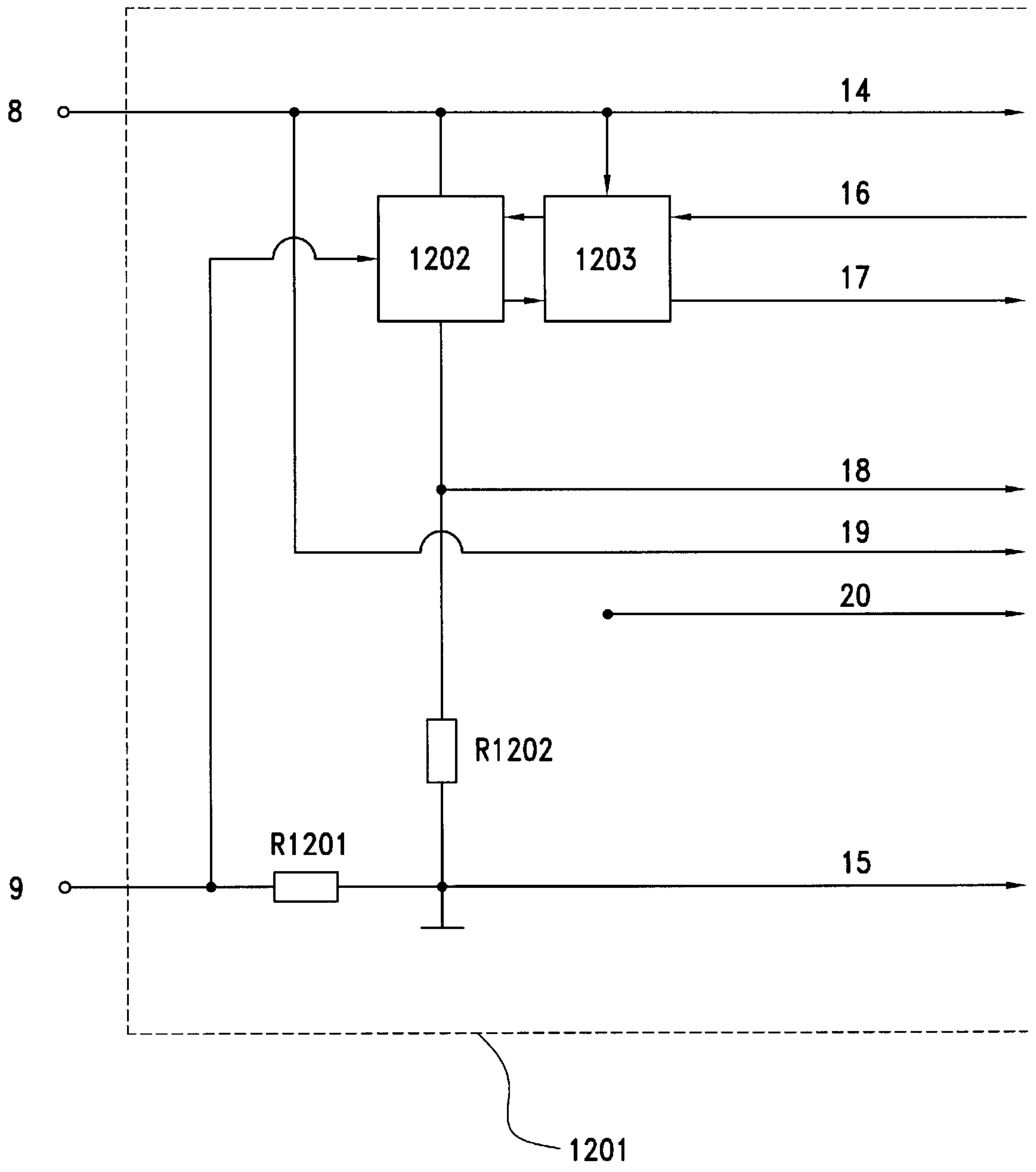

FIG. 12 shows, by way of example, part of such a measuring device. The current stage (1202) maintains the current at a constant level during periods of time when no communication takes place. To transmit digital signals the digital interface (1203) receives from the microcontroller through the control line (16) data which it modulates before passing it on to the current stage which varies the current correspondingly. The type of modulation depends on the specifications of the digital communication employed. Data is received by the digital interface (1203) detecting the signals at the supply line+(14) or at the current stage (1202) and transmitting demodulated data to the microcontroller via the control line (17). As set out previously with reference to FIG. 3, the surplus is determined by measuring the voltage drop across (R1202) by means of the measuring line (18) or by measuring additionally the voltage at the supply line+ (14) by means of the measuring line (19). Similarly, the other methods heretofore described are applicable to measuring devices with digital communication.

What is claimed is:

1. A measuring device for connection to one of: a current loop, as a 4–20 ma current loop and a digital communication, for measuring a process variable with a predetermined maximum power consumption by the measuring device, comprising: a regulating device for regulating the measuring operation of the measuring device in adaptation to the predetermined power consumption, said regulating device regulating the power consumption by the measuring device during a measuring operation of the measuring device in such a fashion that said power consumption is approximated to the predetermined power consumption without the predetermined power consumption being exceeded.

2. The measuring device as claimed in claim 1, wherein the predetermined power consumption is determined by a predetermined current and/or a predetermined supply voltage.

3. The measuring device as claimed in claim 1, wherein said regulating device adjusts the power demand for the measuring operation of the measuring device in response to the predetermined current, the supply voltage or the power determined from said current and said voltage.

4. The measuring device as claimed in claim 1, wherein said regulating device measures or estimates the power demand for the measuring operation of the complete measuring device or at least of one main load of the measuring device, thereby regulating the measuring operation in response to the result obtained.

5. The measuring device as claimed in claim 1, wherein said regulating device measures or estimates the amount of power surplus by which the predetermined power consumption of the measuring device exceeds said power consumption for the measuring operation, regulating the measuring operation such that the power surplus is minimized.

6. The measuring device as claimed in claim 1, for connection to a current loop with a microprocessor, a program memory storing a program for execution by the microprocessor, one or several EEPROM and/or RAM components, circuit elements featuring an operating mode and a low power consumption sleep mode, and a current stage controlled by the microprocessor and regulating the magnitude of a current flowing in the current loop so that it correlates with the magnitude of the measured value of the process variable in a predetermined manner by converting a power surplus in the current stage exceeding the magnitude of the measured value into power loss, wherein execution of the measurement routine by the microprocessor is interrupted in dependence upon the set current through the current loop and/or in dependence upon the supply voltage.

7. The measuring device as claimed in claim 6, wherein the number of measurement cycles per unit of time is set by the microprocessor in dependence upon the set current through the current loop and/or the supply voltage.

8. The measuring device as claimed in claim 1, for connection to a current loop with a microprocessor, a program memory storing a program for execution by the microprocessor, one or several EEPROM and/or RAM components, circuit elements featuring an operating mode and a low power consumption sleep mode, and a current stage controlled by the microprocessor and regulating the magnitude of a current flowing in the current loop so that it correlates with the magnitude of the measured value of the process variable in a predetermined manner by converting a power surplus in the current stage exceeding the magnitude of the measured value into power loss, wherein the power surplus converted into power loss in the current stage is measured and, in the event of said power surplus exceeding a specific predetermined value, the number of measurement cycles per unit of time is increased by the microprocessor, while the number of measurement cycles per unit of time is decreased by the microprocessor if the power surplus has dropped below a specific predetermined value.

9. The measuring device as claimed in claim 1, for connection to a digital communication with a microprocessor, a program memory storing a program for execution by the microprocessor, one or several EEPROM and/or RAM components, circuit elements featuring an operating mode and a low power consumption sleep mode, and a current stage controlled by the microprocessor, wherein execution of the measurement routine by the microprocessor is interrupted in dependence upon the supply voltage.

10. The measuring device as claimed in claim 9, wherein the number of measurement cycles per unit of time is set by the microprocessor in dependence upon the supply voltage.

11. The measuring device as claimed in claim 1, for connection to a digital communication with a microprocessor, a program memory storing a program for execution by the microprocessor, one or several EEPROM and/or RAM components, circuit elements featuring an operating mode and a low power consumption sleep mode, and a current stage controlled by the microprocessor and converting a power surplus in the current stage into power loss, wherein the power surplus converted into power loss in said current stage is measured and, in the event of said power surplus exceeding a specific predetermined value, the number of measurement cycles per unit of time is increased by the microprocessor, while the number of measurement cycles per unit of time is decreased by the microprocessor if the power surplus has dropped below a specific predetermined value.

* * * * *